United States Patent
Guo

(10) Patent No.: US 10,553,565 B2
(45) Date of Patent: Feb. 4, 2020

(54) METHODS AND SYSTEMS FOR ADJUSTING WAFER DEFORMATION DURING WAFER BONDING

(71) Applicant: Yangtze Memory Technologies Co., Ltd., Wuhan, Hubei (CN)

(72) Inventor: Shuai Guo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/046,733

(22) Filed: Jul. 26, 2018

(65) Prior Publication Data

US 2019/0355699 A1 Nov. 21, 2019

Related U.S. Application Data

(63) Continuation of application No. PCT/CN2018/087313, filed on May 17, 2018.

(51) Int. Cl.
  *H01L 25/065* (2006.01)
  *H01L 21/66* (2006.01)
  (Continued)

(52) U.S. Cl.
  CPC .......... *H01L 25/0657* (2013.01); *B81C 3/004* (2013.01); *H01L 22/20* (2013.01);
  (Continued)

(58) Field of Classification Search
  None
  See application file for complete search history.

(56) References Cited

U.S. PATENT DOCUMENTS

| 10,279,575 B2 | 5/2019 | Wagenleitner et al. |
| 2007/0252994 A1 | 11/2007 | Bijnen et al. |

(Continued)

FOREIGN PATENT DOCUMENTS

| CN | 103426774 A | 12/2013 |
| CN | 104538386 A | 4/2015 |

(Continued)

OTHER PUBLICATIONS

International Search Report and Written Opinion of the International Searching Authority directed to related International Patent Application No. PCT/CN2018/087313, dated Feb. 21, 2019; 9 pages.

*Primary Examiner* — Thien F Tran
(74) *Attorney, Agent, or Firm* — Sterne, Kessler, Goldstein & Fox P.L.L.C.

(57) ABSTRACT

Embodiments of methods and systems for adjusting wafer deformation during wafer bonding are provided. The method comprises: releasing inner rings of a first wafer, and applying a first gas pressure to the inner rings of the first wafer, such that the inner rings of the first wafer are in contact with a second wafer; releasing middle rings of the first wafer, such that the middle rings of the first wafer are deformed under a second gas pressure and in contact with the second wafer; releasing inner rings of the second wafer, and applying a third gas pressure less than the first gas pressure to the inner rings of the second wafer; releasing middle rings of the second wafer; and releasing outer rings of the first wafer and releasing outer rings of the second wafer simultaneously.

20 Claims, 13 Drawing Sheets

(51) Int. Cl.
*H01L 23/544* (2006.01)
*B81C 3/00* (2006.01)
*H01L 25/00* (2006.01)

(52) U.S. Cl.
CPC ............ *H01L 23/544* (2013.01); *H01L 25/50* (2013.01); *H01L 2223/54426* (2013.01); *H01L 2225/06593* (2013.01)

(56) References Cited

U.S. PATENT DOCUMENTS

| | | | |
|---|---|---|---|
| 2007/0287264 A1* | 12/2007 | Rogers | H01L 21/187 438/457 |
| 2013/0133828 A1* | 5/2013 | Yoshitaka | B29C 65/00 156/285 |
| 2013/0312907 A1 | 11/2013 | Oh et al. | |
| 2015/0017782 A1* | 1/2015 | Akiyama | H01L 24/741 438/455 |
| 2015/0044786 A1 | 2/2015 | Xin-Hua et al. | |
| 2015/0214082 A1* | 7/2015 | Huang | H01L 21/67092 438/14 |
| 2015/0318260 A1* | 11/2015 | Lin | B23K 20/02 438/455 |

FOREIGN PATENT DOCUMENTS

| | | |
|---|---|---|
| CN | 107993927 A | 5/2018 |
| JP | 2000348992 A | 12/1989 |
| JP | 2014/126762 A | 7/2014 |
| KR | 20110070347 A | 6/2011 |
| TW | 201513172 A | 4/2015 |

\* cited by examiner

METHODS AND SYSTEMS FOR ADJUSTING WAFER DEFORMATION DURING WAFER BONDING

CROSS-REFERENCE TO RELATED APPLICATIONS

This application claims priority to PCT/CN2018/087313 filed on May 17, 2018, the entire contents of which are incorporated herein by reference.

TECHNICAL FIELD

The present disclosure generally relates to the field of semiconductor technology, and more particularly, to methods and systems for adjusting wafer deformation during wafer bonding.

BACKGROUND

Semiconductor chips are integrated to more complicated functionalities and scaled to smaller sizes by improving process technology, circuit design, programming algorithm, and fabrication process. The importance of wafer bonding techniques has been realized in the development of multi-layered micro/nano electromechanical systems (MEMS/NEMS) and three-dimensional integrated circuits (3D ICs) integration aiming at creating more compact and complex systems with improved functionality. This enables semiconductor devices to be fabricated separately and then bonded together, which provides more freedom in design and allows more advanced semiconductor systems to be fabricated.

But as feature sizes of the line widths approach a lower limit and the shrinkage of electromechanical systems into the nanometer range, the lack of effective techniques for achieving bonding alignment has become a critical stumbling block. There is a need for more accurate wafer deformation adjustment and bonding alignment to achieve higher device integration.

BRIEF SUMMARY

Embodiments of methods and systems for adjusting wafer deformation during wafer bonding are disclosed herein.

Disclosed is a method for bonding wafers. The method comprises: (i) releasing inner rings of a first wafer from a first chuck, and applying a first gas pressure to the inner rings of the first wafer, such that the inner rings of the first water are in contact with a second wafer; (ii) releasing middle rings of the first wafer from the first chuck, such that the middle rings of the first wafer are deformed under a second gas pressure and in contact with the second wafer; (iii) releasing inner rings of the second wafer from a second chuck, and applying a third gas pressure to the inner rings of the second water; wherein the third gas pressure is smaller than the first gas pressure; (iv) releasing middle rings of the second wafer from the second chuck; and (v) releasing outer rings of the first wafer from the first chuck and releasing outer rings of the second wafer from the second chuck simultaneously.

In some embodiments, the method further comprises: before operation (i), bonding a first pair of wafers including a plurality of bonding alignment mark pairs on the first pair of wafers, wherein each wafer has a corresponding bonding alignment mark from each of the plurality of bonding alignment mark pairs; analyzing a run-out misalignment between the first pair of wafers based on a measurement of the plurality of bonding alignment mark pairs; and determining an expansion rate of one of a second pair of wafers based on the analysis for compensating the run-out misalignment; wherein the second pair of wafers includes the first wafer and the second wafer, and the first gas pressure is determined based at least on the expansion rate.

In some embodiments, analyzing the run-out misalignment between the first pair of wafers comprises: calculating a run-out misalignment between the bonding alignment marks of each bonding alignment mark pair; and calculating an average of the run-out misalignments corresponding to the plurality of bonding alignment mark pairs as the run-out misalignment between the first pair of wafers.

In some embodiments, calculating the run-out misalignment between each bonding alignment mark pair comprises: determining a first distance between a center of a top wafer of the first pair of wafers and a first bonding alignment mark in a bonding alignment mark pair that is on the top wafer; determining a second distance between the first bonding alignment mark and a second bonding alignment mark in the bonding alignment mark pair that is on a bottom wafer of the first pair of wafers; determining an angle between a connection line of the bonding alignment mark pair and a radiation direction of the first bonding alignment mark on the top wafer; and calculating the run-out misalignment between the bonding alignment mark pair based on the first distance, the second distance, and the angle.

In some embodiments, the method further comprises: before operation (i), determining the first wafer is a top wafer of the second pair of wafers if the run-out misalignment between the first pair of wafers is positive; determining the first wafer is a bottom wafer of the second pair of wafers if the run-out misalignment between the first pair of wafers is negative; and determining the expansion rate of the first wafer based on a magnitude of the run-out misalignment between the first pair of wafers.

In some embodiments, the method further comprises: before operation (i), adjusting an initial distance between the first wafer and the second wafer based at least on the expansion rate.

In some embodiments, operation (i) comprises: purging gas, by a plurality of vents in a region of the first chuck corresponding to the inner rings of the first wafer, to generate the first gas pressure in a space between the inner rings of the first wafer and the first chuck, such that the inner rings of the first wafer protrude from the first chuck; and evacuating gas, by a plurality of vents in a region of the first chuck corresponding to the middle rings and the outer rings of the first wafer, such that the middle rings and outer rings of the first wafer are attached on the first chuck.

In some embodiments, operation (ii) comprises: stopping evacuating gas, by a plurality of vents in a region of the first chuck corresponding to the middle rings of the first wafer, such that the gas in the space between the inner rings of the first wafer and the first chuck fills into a space between the middle rings of the first wafer and the first chuck to generate the second gas pressure; and maintaining the second gas pressure for a time period determined based at least on the expansion rate, such that the middle rings of the first wafer are deformed under the second gas pressure.

In some embodiments, the method further comprises: evacuating gas, during operations (i) and (ii), by a plurality of vents on the second chuck, such that the second wafer is entirely attached on the second chuck.

In some embodiments, operation (iii) comprises: purging gas, by a plurality of vents in a region of the second chuck corresponding to the inner rings of the second wafer, to generate the third gas pressure in a space between the inner rings of the second wafer and the second chuck; and evacuating gas, by a plurality of vents in a region of the second chuck corresponding to the middle rings and the outer rings of the second wafer, such that the middle rings and outer rings of the second wafer are attached on the second chuck.

In some embodiments, operation (iv) comprises: stopping evacuating gas, by a plurality of vents in a region of the second chuck corresponding to the middle rings of the second wafer, such that the gas in the space between the inner rings of the second wafer and the second chuck fills into a space between the middle rings of the second wafer and the second chuck to generate a fourth gas pressure; wherein a deformation of the middle rings of the second wafer under the fourth gas pressure is less than the a deformation of the middle rings of the first wafer under the second gas pressure.

In some embodiments, operation (v) comprises: stopping evacuating gas simultaneously, by a plurality of vents in a region of the first chuck corresponding to the outer rings of the first wafer and a plurality of vents in a region of the second chuck corresponding to the outer rings of the second wafer, such that the first wafer and the second wafer are bonded with each other.

Another aspect of the present disclosure provides a system for bonding wafers, comprising: a wafer support module including a first chuck and a second chuck configured to support a first pair of wafers respectively; an alignment monitoring module configured to measure positions of a plurality of bonding alignment mark pairs on the first pair of wafers; a hardware processor configured to analyze a run-out misalignment between the first pair of wafers based on the positions of the plurality of bonding alignment mark pairs; a wafer position adjustment module configured to adjust positions of wafer support module; and a wafer deformation adjustment module configured to compensate the run-out misalignment during bonding of a second pair of wafers by adjusting gas pressures between each of the second pair of wafers and the corresponding chuck.

In some embodiments, the hardware processor is further configured to: determine whether the run-out misalignment is within an allowable error range; and in response to determining that the run-out misalignment is outside the allowable error range, control the wafer position adjustment module to adjust an initial distance between a first wafer and a second wafer of the second pair of wafers, and control the wafer deformation adjustment module to compensate the run-out misalignment during bonding of the second pair of wafers.

In some embodiments, the wafer deformation adjustment module is configured to: (i) release inner rings of a first wafer from a first chuck, and apply a first gas pressure to the inner rings of the first wafer, such that the inner rings of the first wafer are in contact with a second wafer; (ii) release middle rings of the first wafer from the first chuck, such that the middle rings of the first wafer are deformed under a second gas pressure and in contact with the second wafer; (iii) release inner rings of the second wafer from a second chuck, and apply a third gas pressure to the inner rings of the top wafer, wherein the third gas pressure is smaller than the first gas pressure; (iv) release middle rings of the second wafer from the second chuck; and (v) release outer rings of the first wafer from the first chuck and releasing outer rings of the second wafer from the second chuck simultaneously.

In some embodiments, the hardware processor is further configured to: determine an expansion rate of one of the second pair of wafers based on the analysis for the run-out misalignment between the first pair of wafers; and determine the initial distance between a first wafer and a second wafer of the second pair of wafers, and the first gas pressure based at least on the expansion rate.

In some embodiments, the hardware processor is further configured to: calculating a run-out misalignment between the bonding alignment marks of each bonding alignment mark pair; and calculating an average of the run-out misalignments corresponding to the plurality of bonding alignment mark pairs as the run-out misalignment between the first pair of wafers.

In some embodiments, the hardware processor is further configured to: determining a first distance between a center of a top wafer of the first pair of wafers and a first bonding alignment mark in a bonding alignment mark pair that is on the top wafer; determining a second distance between the first bonding alignment mark and a second bonding alignment mark in the bonding alignment mark pair that is on a bottom wafer of the first pair of wafers; determining an angle between a connection line of the bonding alignment mark pair and a radiation direction of the first bonding alignment mark on the top wafer; and calculating the run-out misalignment between the bonding alignment mark pair based on the first distance, the second distance, and the angle.

In some embodiments, the hardware processor is further configured to: determine the first wafer is a top wafer of the second pair of wafers if the run-out misalignment between the first pair of wafers is positive; determine the first wafer is a bottom wafer of the second pair of wafers if the run-out misalignment between the first pair of wafers is negative; and determine the expansion rate of the first wafer based on a magnitude of the run-out misalignment between the first pair of wafers.

In some embodiments, the hardware processor is further configured to: control a plurality of vents in a region of the first chuck corresponding to the inner rings of the first wafer to purge gas to generate the first gas pressure in a space between the inner rings of the first wafer and the first chuck, such that the inner rings of the first wafer protrude from the first chuck; and control a plurality of vents in a region of the first chuck corresponding to the middle rings and the outer rings of the first wafer to evacuate gas, such that the middle rings and outer rings of the first wafer are attached on the first chuck.

In some embodiments, the hardware processor is further configured to: control a plurality of vents in a region of the first chuck corresponding to the middle rings of the first wafer to stop evacuating gas, such that the gas in the space between the inner rings of the first wafer and the first chuck fills into a space between the middle rings of the first wafer and the first chuck to generate the second gas pressure; and control the plurality of vents on the first chuck to maintain the second gas pressure for a time period determined based at least on the expansion rate, such that the middle rings of the first wafer are deformed under the second gas pressure.

In some embodiments, the hardware processor is further configured to: control a plurality of vents on the second chuck to evacuate gas during operations (i) and (ii), such that the second wafer is entirely attached on the second chuck.

In some embodiments, the hardware processor is further configured to: control a plurality of vents in a region of the second chuck corresponding to the inner rings of the second wafer to purge gas to generate the third gas pressure in a space between the inner rings of the second wafer and the second chuck; and control a plurality of vents in a region of the second chuck corresponding to the middle rings and the outer rings of the second wafer to evacuate gas, such that the middle rings and outer rings of the second wafer are attached on the second chuck.

In some embodiments, the hardware processor is further configured to: control a plurality of vents in a region of the second chuck corresponding to the middle rings of the second wafer to stop evacuating gas, such that the gas in the space between the inner rings of the second wafer and the second chuck fills into a space between the middle rings of the second wafer and the second chuck to generate a fourth gas pressure; wherein a deformation of the middle rings of the second wafer under the fourth gas pressure is less than the a deformation of the middle rings of the first wafer under the second gas pressure.

In some embodiments, the hardware processor is further configured to: control a plurality of vents in a region of the first chuck corresponding to the outer rings of the first wafer and a plurality of vents in a region of the second chuck corresponding to the outer rings of the second wafer to stop evacuating gas simultaneously, such that the first wafer and the second wafer are bonded with each other.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
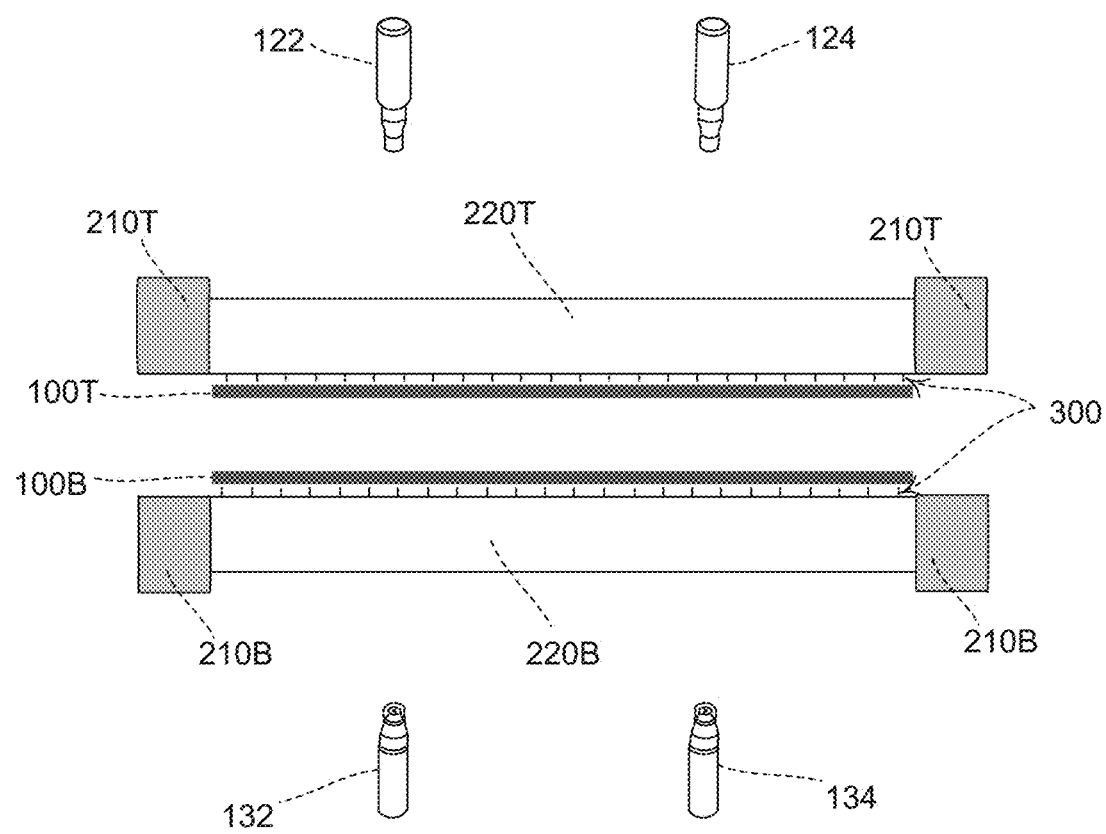
FIG. 1 illustrates a schematic diagram of an exemplary wafer bonding system according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in pail upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within. For example, 10-30% of the value (e.g., ±10%, ±20%, or ±30% of the value).

In accordance with some embodiments of the present disclosure, methods and systems for adjusting wafer deformation during wafer bonding are disclosed. The disclosed methods and systems can compensate the translational misalignment, the rotational misalignment and the run-out misalignment during bonding wafer pairs, thereby improving the alignment accuracy, reducing the size of the devices, and increasing the product yield.

Optical alignment is a commonly used method to achieve wafer bonding alignment. By positioning one wafer with respect to another and aligning the two wafers using bonding alignment marks observed through optical objectives, the alignment between the pair of wafers can be achieved. FIG. 1 illustrates a schematic diagram of an exemplary wafer bonding system, according to some embodiments of the present disclosure.

In some embodiments, a wafer bonding system can include a first stage 210B having a first aperture, and a second stage 210T having a second aperture. A first chuck 220B can be mounted on or attached to the first aperture of the first stage 210B, and a second chuck 220T can be mounted on or attached to the second aperture of the second stage 210T. The first stage 210B and the first chuck 220B are also referred to herein collectively as a first support, and the second stage 210T and the second chuck 220T are also referred to herein collectively as a second support. The first chuck 220B can be adapted to support a first wafer 100B, and the second chuck 220T is configured to support a second wafer 100T. As shown in FIG. 1, the first chuck 220B is also referred to herein as a bottom chuck 201B, and the first wafer 100B is also referred to herein as a bottom wafer 100B. The second chuck 220T is also referred to herein as a top chuck 201T, and the second wafer 100T is also referred to herein as a top wafer 100T.

In some embodiments, the first chuck 220B and the second chuck 220T can be substantially transparent. For example, the first chuck 220B and the second chuck 220T can include glass, quartz, or other type of transparent material. In other embodiments, the first chuck 220B and the second chuck 220T can include a translucent or opaque material. In yet other embodiments, the first chuck 220B is substantially transparent, and the second chuck 220T is translucent or opaque, or vice versa. In embodiments where at least the first chuck 220B includes a substantially transparent material, the alignment of the wafers and is improved due to increased visibility of bonding alignment marks on the wafers 100B and 100T.

The wafer bonding system can further include a vacuum module. In some embodiments, the vacuum module can include any suitable equipment for adjusting the gas pressure between the first wafer 1009 and the first chuck 220B, as well as the gas pressure between the second wafer 100T and the second chuck 220T. For example, the vacuum module can include one or more gas supply tubes and/or gas exhaust tubes (not shown in the figures) that are connected to a plurality of vents 300 as shown in FIG. 1. In some embodiments, the vents 300 can be arranged in a circular array on the surface of each of the first chuck 220B and the second chuck 220T that is face to the wafer. In some embodiments, the vents 300 can be used to purge and/or evacuate gas between the chunk and the wafer on the chunk. The gas can be gas or any suitable inert gas, such as nitrogen.

The wafer bonding system can further include an alignment monitoring module. In some embodiments, the alignment monitoring module can include any suitable optical equipment for monitoring bonding alignment marks on the bottom wafer 100B and/or the top wafer 100T, and detecting the positions of the bonding alignment marks. For example, the alignment monitoring module can include one or more infrared (IR) charge coupled device (CCD) scopes comprising an IR live CCD configured to emit reflective infrared (RIR) or transparent infrared (TIR) energy. In some embodiments, the alignment monitoring module can further include any suitable optical equipment for positioning the bonding alignment marks, such as a linear variable differential transformer (LVDT), a laser interferometer, or an optical linear encoder and decoder, etc.

In some embodiments, as shown in FIG. 1, the alignment monitoring module includes at least two top scopes 122 and 124 that are disposed proximate the second chuck 220T and two bottom scopes 132 and 134 that are disposed proximate the first chuck 220B. The position of top scope 122 can correspond to the position of bottom scope 132, and the position of top scope 124 can correspond to the position of bottom scope 134. The top scope 122 and the bottom scope 132 can be referred to a first scope pair, and the top scope 124 and the bottom scope 134 can be referred to a second scope pair. In some embodiments, before loading a wafer, each scope pair can be aligned with each other. As such, after loading a water, a bonding alignment mark on the water that is aligned with the scope pair can be positioned with a specific coordinate.

The wafer bonding system can further include a wafer position adjustment module (not shown in figures) for adjusting the positions of the first and second supports. In some embodiments, the wafer position adjustment module can include any suitable equipment coupled with the first support and/or the second support for adjusting the positions of the first support and/or the second support, such as a piezoelectric motor, a linear motor, etc. The wafer position adjustment module can be configured to adjust linear positions (e.g., x-coordinate position, y-coordinate position, and z-coordinate position), and/or an angular position of the bottom wafer 100B and/or the top wafer 100T by controlling the movement of the first support and/or the second support.

The wafer bonding system can further include a wafer deformation adjustment module (not shown in figures) for adjusting the deformation of the bottom wafer 100B and/or the top wafer 100T during the bonding process of the bottom wafer 100B and the top wafer 100T. In some embodiments, the wafer deformation adjustment module can be connected with the alignment monitoring module, the vacuum module and the wafer position adjustment module. For example, the wafer deformation adjustment module can adjust the deformation of one of the bottom wafer 100B and the top wafer 100T based on the information received from the alignment monitoring module. As another example, the wafer deformation adjustment module can adjust the deformation of the wafers by controlling the wafer position adjustment module to adjust the distance between the top wafer 100T and the bottom wafer 100B, and controlling the vacuum module to adjusting the gas pressure value and the gas pressure maintaining time applied to the top wafer 100T and the bottom water 100B.

Figure 2A:
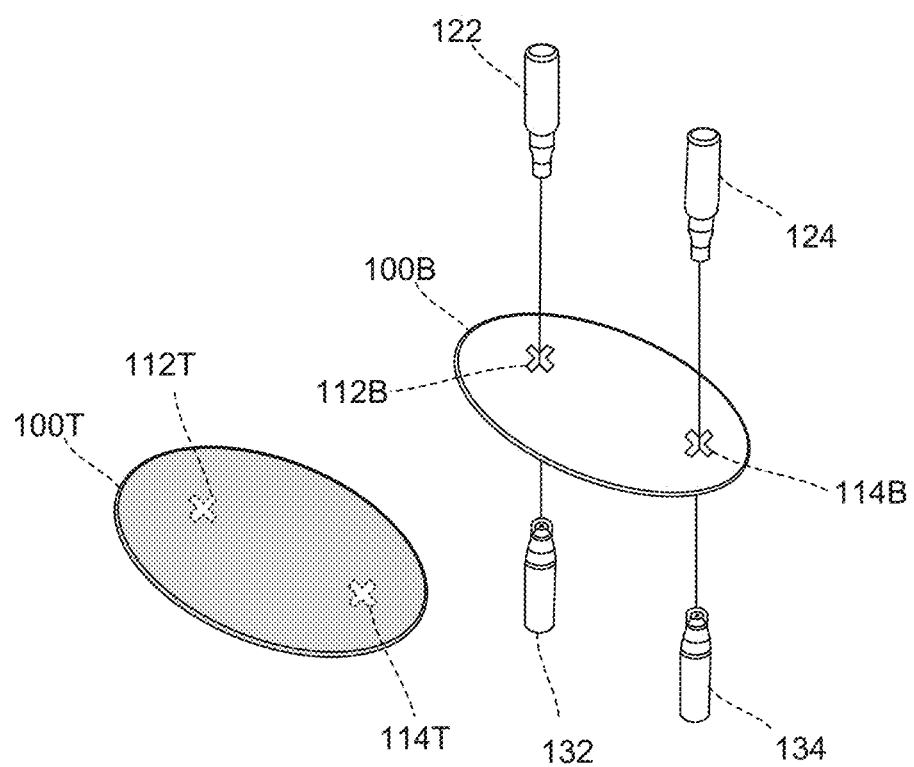
FIGS. 2A-2D illustrate schematic diagrams of an exemplary wafer bonding system in certain stages to bond a pair of wafers according to some embodiments of the present disclosure.

FIGS. 2A-2D illustrate schematic diagrams of an exemplary wafer bonding process in certain stages in accordance with some embodiments of the present disclosure. As shown in FIG. 2A, the wafer position adjustment module can control the position of the first support that carries the bottom wafer 100B, such that a first bottom bonding alignment mark 112B on the bottom wafer 100B can be aligned with the first bottom scope 132, and a second bottom bonding alignment mark 114B on the bottom wafer 100B can be aligned with the second bottom scope 134. After the alignment, the position of the first support can be recorded, and then the wafer position adjustment module can control the first support to move the bottom water away from the recorded position.

Figure 2B:
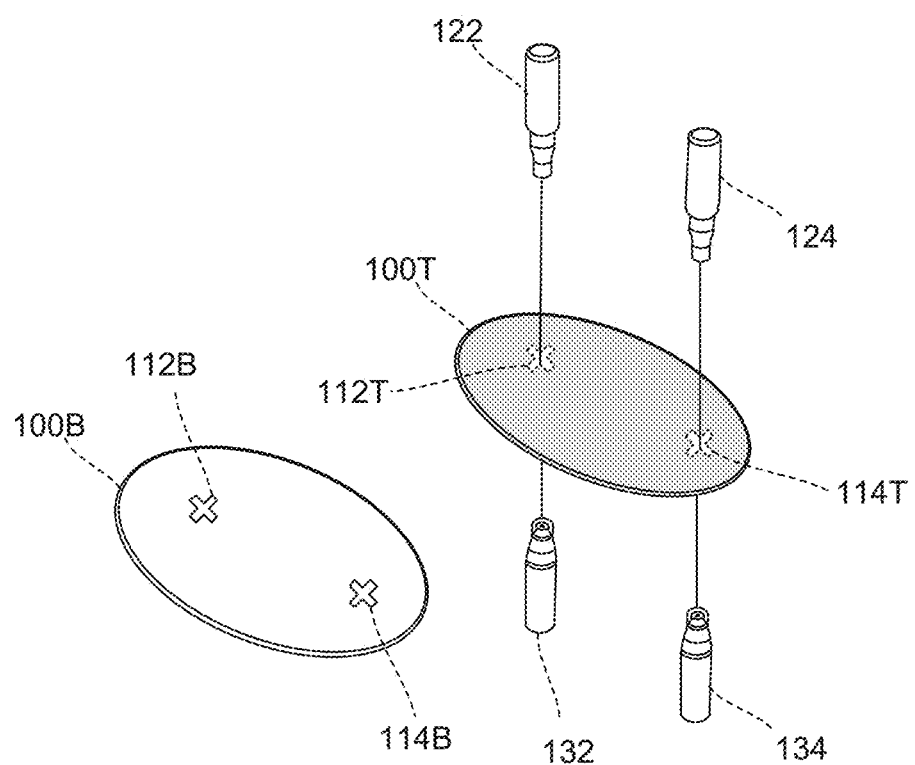

Referring to FIG. 2B, the wafer position adjustment module can control the position of the second support that carries the top wafer 100T, such that a first top bonding alignment mark 112T on the top wafer 100T can be aligned with the first top scope 122, and a second top bonding alignment mark 114T on the top wafer 100T can be aligned with the second top scope 124.

Figure 2C:
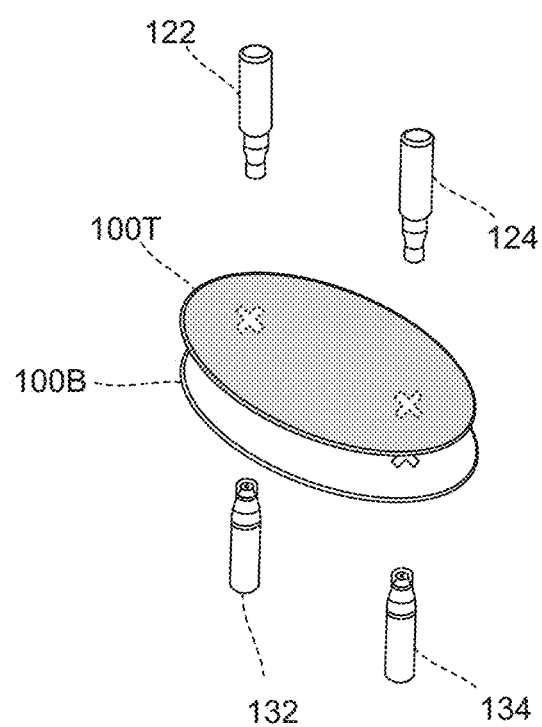

Referring to FIG. 2C, the wafer position adjustment module can control the first support to retune to the recorded position. As such, the first bottom bonding alignment mark 112B and the first top bonding alignment mark 112T can be aligned with each other, and the second bottom bonding alignment mark 114B and the second top bonding alignment mark 114T can be aligned with each other. It is noted that, each pair of bottom bonding alignment mark and top bonding alignment mark is also referred to herein as a bonding alignment mark pair. By aligning two bonding alignment mark pairs, the bottom wafer 100B and the top wafer 100T can be aligned with each other.

Figure 2D:
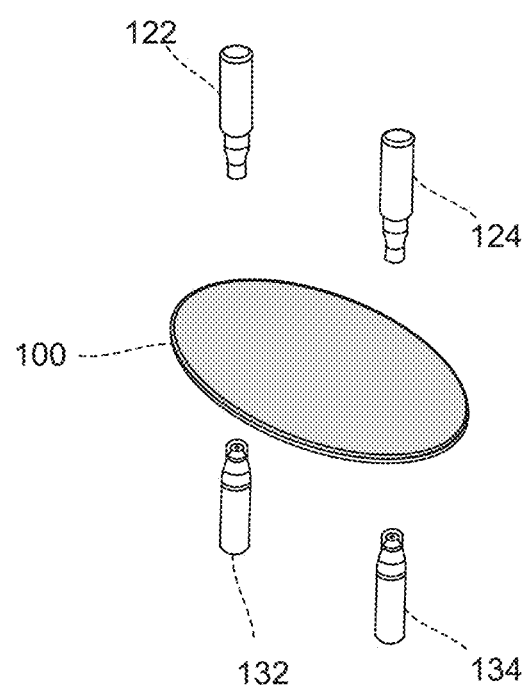

Referring to FIG. 2D, after the alignment process, the bottom wafer 100B and the top wafer 100T can be bonded to form a bonded wafer pair 100 by using any suitable bonding method. In some embodiments, based on the run-out alignment analysis of a previous bonded wafer pair, a deformation adjustment requirement can be determined. For example, one of the bottom wafer 100B and the top wafer 100T can be determined to be expanded in a certain degree during the bonding process. As such, the wafer deformation adjustment module can adjust the deformation of one of the bottom wafer 100B and the top wafer 100T by adjusting one or more bonding parameters during the bonding process. For example, the wafer deformation adjustment module can adjust the deformation of the wafers by controlling the wafer position adjustment module to adjust the distance between the top wafer 100T and the bottom wafer 100B, and controlling the vacuum module to adjusting the gas pressure value and the gas pressure maintaining time applied to the top wafer 100T and the bottom wafer 100B.

Figure 3:
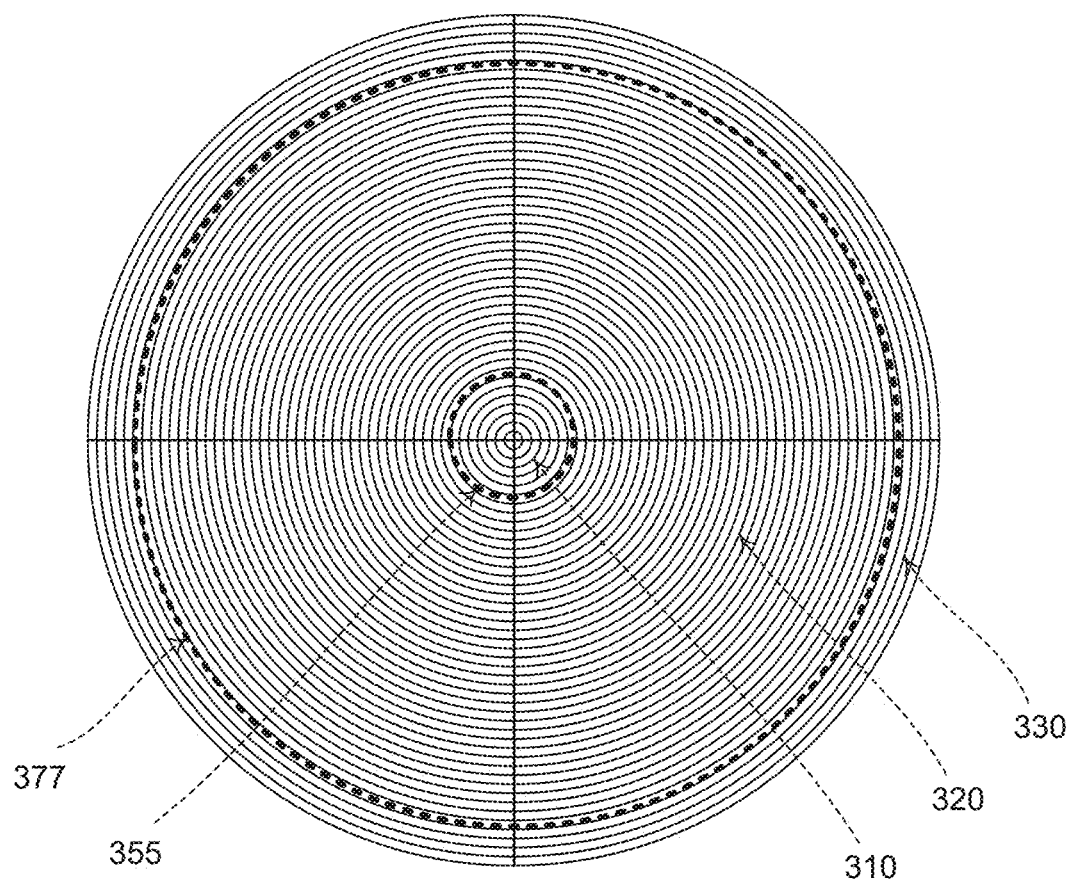
FIG. 3 illustrates a top view of an exemplary wafer according to some embodiments of the present disclosure.

FIG. 3 illustrates a top view of an exemplary wafer according to some embodiments of the present disclosure. The wafer (e.g., the bottom wafer 100B, or the top wafer 100T) can include three portions. The region in the inner dashed circle 355 can be referred as inner rings 310, the region between the inner dashed circle 355 and outer dashed circle 377 can be referred as middle rings 320, and the region outside the outer dashed circle 377 can be referred as outer rings 330. In some embodiments, the areas of the inner rings 310 and the outer rings 330 can be small, while the area of the middle rings 320 can be large.

As described above, when the wafer is placed on the chuck, a plurality of vents 300 as shown in FIG. 1 on the chuck can evacuate the gas between the chuck and the wafer, such that the wafer can be fixed on the chuck. In some embodiments, the plurality of vents 300 corresponding to different regions of the wafer can be controlled to evacuate and/or purge gas, such that the gas pressure between different regions of the wafer and the chuck can be adjusted.

Figure 4:
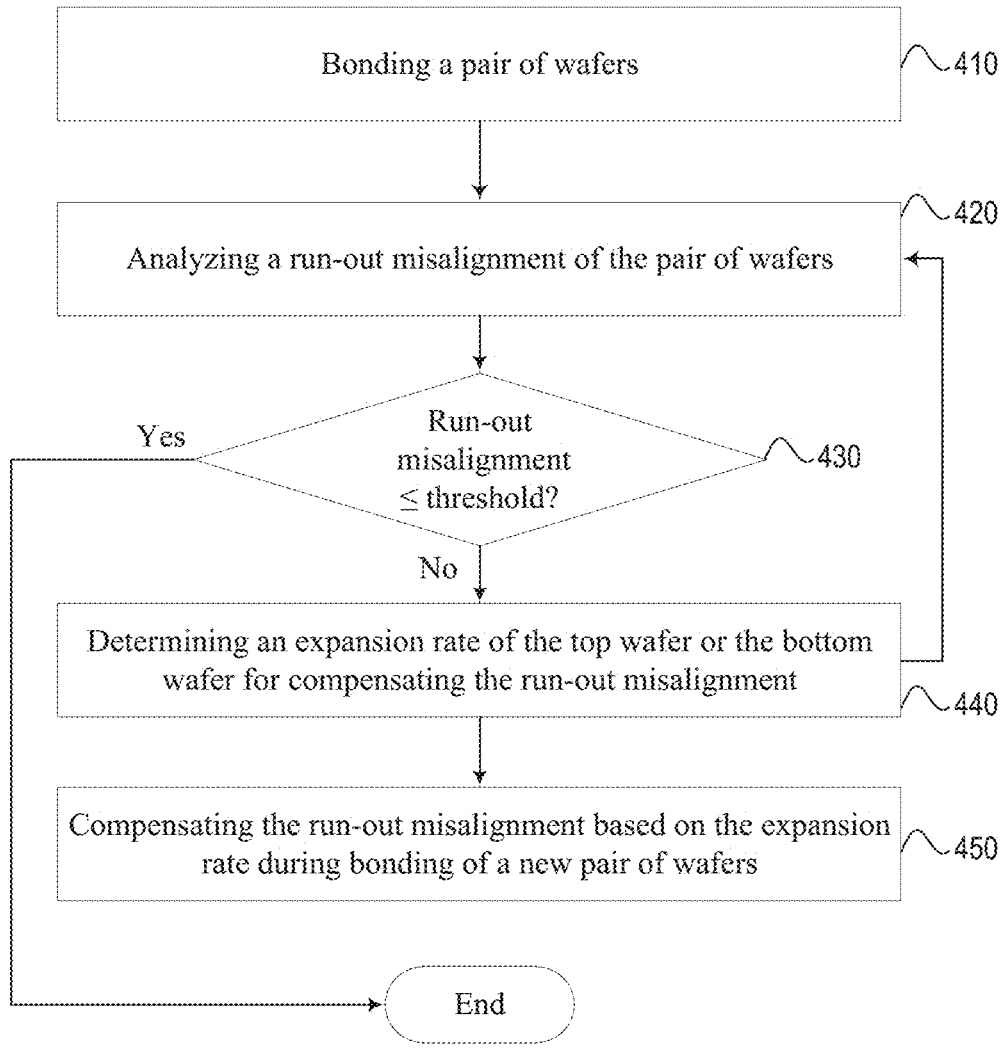
FIG. 4 illustrates a flow diagram of an exemplary method for adjusting run-out misalignment during wafer bonding according to some embodiments of the present disclosure.

FIG. 4 illustrates a flow diagram of an exemplary method 400 for adjusting wafer deformation during wafer bonding in accordance with some embodiments of the present disclosure. As shown in FIG. 4, the method 400 starts at operation 410, in which a pair of wafers can be bonded. In some embodiments, the pair of wafers can include a bottom wafer and a top wafer, and can be bonded by performing the bonding process described above in connection with FIGS. 2A-2D.

Figure 5:
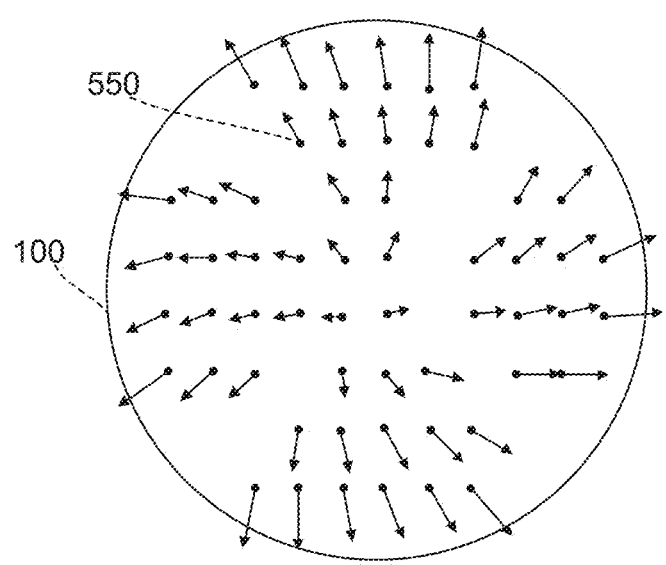
FIG. 5 illustrates a top view of an exemplary wafer misalignment including run-out misalignment according to some embodiments of the present disclosure.

After bonding the pair of wafers, the method 400 processes to operation 420, in which a run-out misalignment (e.g., expansion misalignment) of the pair of wafers can be analyzed. FIG. 5 illustrates a top view of an exemplary wafer misalignment including run-out misalignment in accordance with some embodiments of the present disclosure. The misalignment 550 of each pair of bonding alignment marks on the bonded wafer pair 100 is indicated by a dot representing a location of one bonding alignment mark on one wafer and an arrow representing a displacement between the location of one bonding alignment mark on the one wafer and a location of the corresponding bonding alignment mark on the other wafer.

Figure 6:
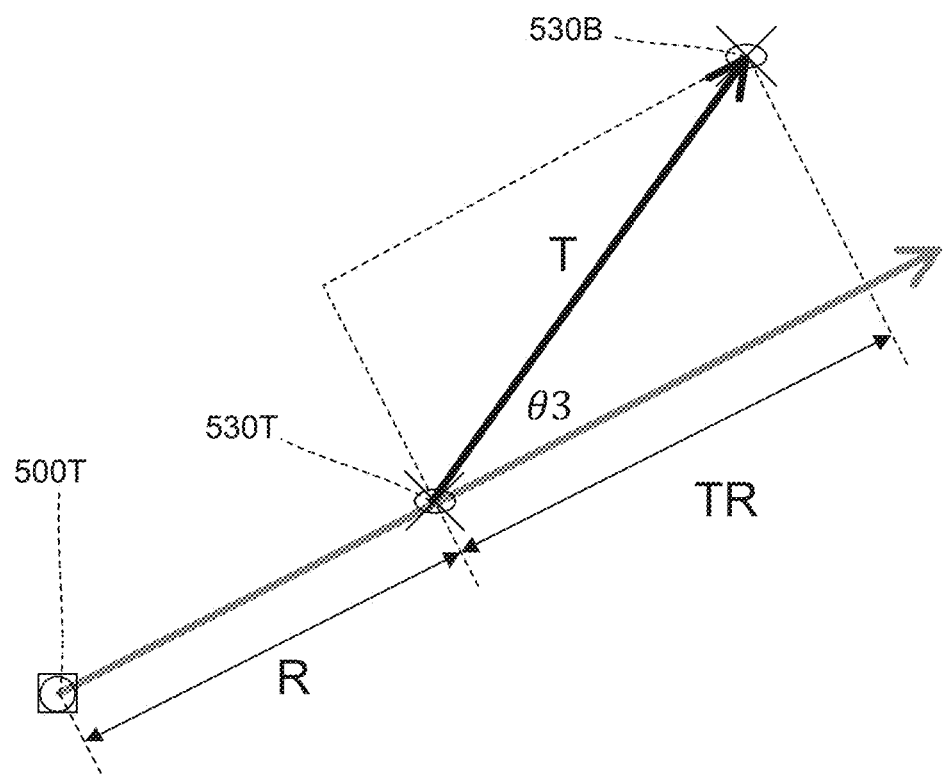
FIG. 6 illustrates a schematic diagram of exemplary mark analyses for run-out misalignment according to some embodiments of the present disclosure.

FIG. 6 illustrates a schematic diagram of exemplary mark analyses for run-out misalignment in accordance with some embodiments of the present disclosure. In some embodiments, a radial component of the run-out misalignment calculated based on a bonding alignment mark pair may gradually increase with the increasing of the radius from the bonding alignment mark pair to the wafer center. As such, assuming the deformation of the wafers is uniform, the radial component of the run-out misalignment calculated based on a bonding alignment mark pair is subsequently equal to a millionth of the radius from the bonding alignment mark pair to the wafer center.

As shown in FIG. 6, a distance between the center of the top wafer 500T and a top bonding alignment mark 530T is R. A distance between the top bonding alignment mark 530T and the bottom bonding alignment mark 530B in the pair is T. A projected distance TR of distance T on the radiation direction of the top bonding alignment mark 530T on the top wafer can be T×Cos θ3, where θ3 is the angle between the connection line of the bonding alignment mark pair 530T and 530B and the radiation direction of the top bonding alignment mark 530I on the top wafer. The run-out misalignment ratio ΔR of the bonding alignment mark pair 530T and 530B can be equal to parts per million (PPM) of a ratio of the projected distance TR and the distance R. That is, $\Delta R = T \times \cos \theta_3 \times 10^6 / R$.

In some embodiments, multiple misalignments 550 of bonding alignment mark pairs on the bonded wafer pair 100 can be measured to calculate the run-out misalignment between the pair of wafers. For example, an average of the run-out misalignment ratios of multiple bonding alignment mark pairs can be calculated as a mean run-out misalignment ratio between the pair of wafers. That is, $\overline{\Delta R} = \Sigma_n \Delta R_n / n$, where n is the number of bonding alignment mark pairs used for calculating the mean run-out misalignment ratio $\overline{\Delta R}$. Then, the average of the run-out misalignments of multiple bonding alignment mark pairs can be calculated as a mean run-out misalignment between the pair of wafers, which can be $\overline{\Delta R} \times R$.

It is noted that, assuming the translational misalignment and the rotational misalignment have been compensated, the center of the top wafer 500I and the center of the bottom wafer 500B is overlapped with each other. It is also noted that, the run-out misalignment is calculated based on the top wafer as shown in FIG. 6. However, the run-out misalignment can also be calculated based on the bottom wafer. In doing so, the value of the mean run-out misalignment can be $-\overline{\Delta R} \times R$.

Referring back to FIG. 4, after analyzing the run-out misalignment between the pair of wafers, the method 400 processes to operation 430, in which the run-out misalignment between the pair of wafers can be compared with a predetermined threshold value. If the run-out misalignment between the pair of wafers is less than or equal to the predetermined threshold value ("Yes" at 260), it can be determined that run-out misalignment between the pair of wafers are within an allowable error range. For example, an absolute value of the mean run-out misalignment ratio $\overline{\Delta R}$ of the pair of wafers can be compared with a predetermined threshold value, such as a value within a range between 0.4 PPM and 1 PPM. If the absolute value of the mean run-out misalignment ratio $\overline{\Delta R}$ is less than the predetermined threshold value, it can be determined that the run-out misalignment between the pair of wafers is within the allowable error range.

If the absolute value of the run-out misalignment between the pair of wafers is larger than the predetermined threshold value ("No" at 430), it can be determined that the run-out misalignment between the pair of wafers are not within an allowable error range. In such case, the method 400 can process to operation 440, in which an expansion rate of the top wafer or the bottom wafer for compensating the run-out misalignment can be determined.

In some embodiments, the mean run-out misalignment ratio $\overline{\Delta R}$ can determine an expansion rate of the top wafer or the bottom wafer to compensate the run-out misalignment between the pair of wafers. For example, if the mean run-out misalignment ratio $\overline{\Delta R}$ is positive, it can be determined that the top wafer should be expended to compensate the run-out misalignment. If the mean run-out misalignment ratio $\overline{\Delta R}$ is negative, it can be determined that the bottom wafer should be expended to compensate the run-out misalignment. The magnitude of the expansion rate can be calculated based on the absolute value of mean run-out misalignment ratio $\overline{\Delta R}$.

After determining the expansion rate of the top wafer or the bottom wafer, the method 400 processes to operation 450, in which a new pair of wafers can be bonded, and during the bonding process of the new pair of wafers, the wafer or the bottom wafer of the new pair of wafers can be expended based on the expansion rate to compensate the run-out misalignment.

In some embodiments, when bonding the new wafer pair, the wafer deformation adjustment module of the wafer bonding system can adjust the deformation of one of the bottom wafer and the top wafer by adjusting one or more bonding parameters during the bonding process. For example, the wafer deformation adjustment module can adjust the deformation of the wafers by controlling the wafer position adjustment module to adjust the distance between the top wafer 100T and the bottom wafer 100B, and controlling the vacuum module to adjusting the gas pressure value and the gas pressure maintaining time applied to the top wafer 100T and the bottom wafer 100B.

In some embodiments, the plurality of vents 300 corresponding to different regions of the wafer can be controlled to evacuate and/or purge gas, such that the gas pressure between different regions of the water and the chuck can be adjusted. A detailed exemplary process to adjust the deformation of a wafer during the wafer bonding can be referred to FIGS. 7 and 8A-8E described above. After bonding the new wafer pair, the method 400 can go back to operations 420, 430 and 440, in which the run-out misalignment between the new pair of wafers can be analyzed and evaluated.

If the absolute value of the run-out misalignment ratio between the pair of wafers is less than or equal to the predetermined threshold value ("Yes" at 430), the method 400 for adjusting wafer deformation during wafer bonding can end. That is, after being determined that the run-out misalignment between the pair of wafers is within the allowable error range, a batch of wafer pairs can be bonded subsequently based on the parameters determined in the previous bonding round.

Figure 7:
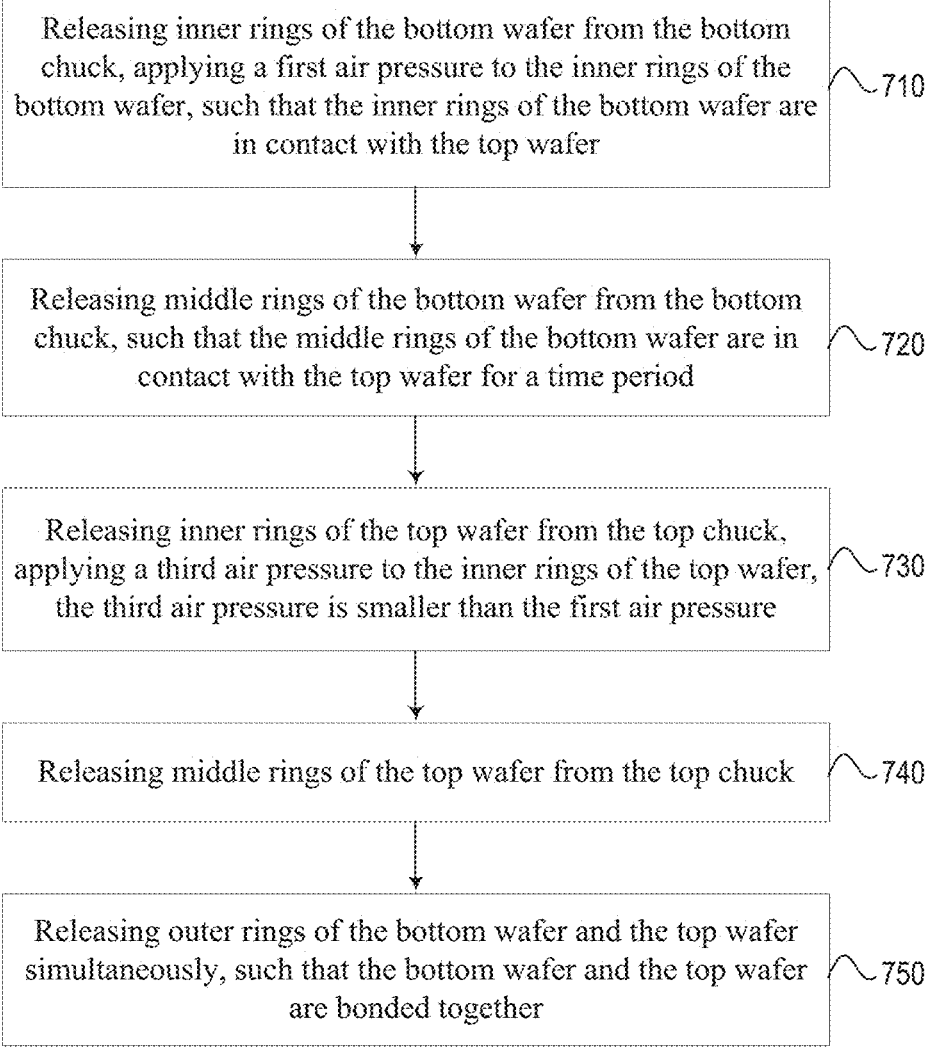
FIG. 7 illustrates a flow diagram of an exemplary method for adjusting wafer deformation during wafer bonding according to some embodiments of the present disclosure.

FIG. 7 illustrates a flow diagram of an exemplary method for adjusting wafer deformation during wafer bonding according to some embodiments of the present disclosure. FIGS. 8A-8E illustrate schematic diagrams of exemplary wafer bonding at certain stages of the method shown in FIG. 7 to adjust wafer deformation. It is noted that, the method shown in FIGS. 7 and 8A-8E is employed to expand the bottom wafer as an example. If it is determined that the top wafer is to be expanded at the operation 440 described above in connection with FIG. 4, it will be apparent to a person skilled in the pertinent art that the disclosed method can also be employed to expand the top wafer by simply exchange the operations to the bottom wafer and the top wafer.

As described above, before bonding the bottom wafer 100B and the top wafer 100T, the bottom wafer 100B and the top wafer 100T can be fixed on the bottom chuck 220B and the top chuck 220T respectively. For example, the vacuum module of the wafer bonding system can evacuate the gas between the wafer and the corresponding chuck through the multiple vent 300, such that the wafer is attached to the corresponding chuck by the gas pressure.

After the aligning process the process described above in connection with FIGS. 2A-2C, the method for adjusting wafer deformation 700 can start at operation 710 as shown in FIG. 7, in which the inner rings 310B of the bottom wafer 100B can be released from the bottom chuck 220B, and a first gas pressure can be applied to the inner rings 310B of the bottom wafer 100B, such that the inner rings 310B of the bottom wafer 100B are in contact with the top wafer 100T.

Figure 8A:
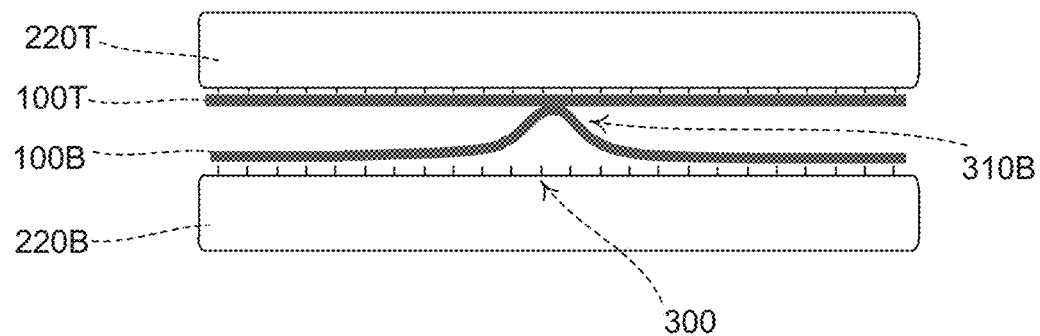
FIGS. 8A-8E illustrate schematic diagrams of exemplary wafer bonding at certain stages to adjust wafer deformation according to some embodiments of the present disclosure.

As shown in FIG. 8A, in some embodiments, the vents 300 in the region of the bottom chuck 220B corresponding to the inner rings 310B of the bottom wafer 100B can purge gas, such that the inner rings 310B of the bottom wafer 100B can protrude under a first gas pressure. The first gas pressure in the space between the inner rings 310B of the bottom wafer 100B and the bottom chuck 220B can be controlled by the volume of gas purged into the space through the vents 300. The first gas pressure can determine the deformation of the inner rings 310B of the bottom wafer 100B to control the inner rings 310B of the bottom wafer 100B to protrude and be in contact with the top wafer 100T.

In the same time, the vents 300 in the region of the bottom chuck 220B corresponding to the middle rings and outer rings of the bottom wafer 100E can still evacuate gas to keep the middle rings and outer rings of the bottom wafer 100B being attached on the bottom chuck 220B. During the operation 710, the vents 300 on the top chuck 220T can evacuate gas to keep the entire top wafer 100T being attached on the top chuck 220T.

It is noted that, in some embodiments, an initial distance between the bottom wafer 100B and the top wafer 100T can be determined based on the expansion rate of the bottom wafer determined at operation 440 described above in connection with FIG. 4. Further, in some embodiments, the first gas pressure in the space between the inner rings 310B of the bottom wafer 100B and the bottom chuck 220B can also be determined based on the expansion rate of the bottom wafer determined at operation 440 described above in connection with FIG. 4.

Referring back to FIG. 7, after the inner rings 310B of bottom wafer 100B are in contact with the top wafer 100T, the process 700 can processes to operation 720, in which the middle rings 320B of the bottom wafer 100B can be released from the bottom chuck 220B, such that the middle rings 320B of the bottom wafer 100B are in contact with the top wafer 100T.

Figure 8B:
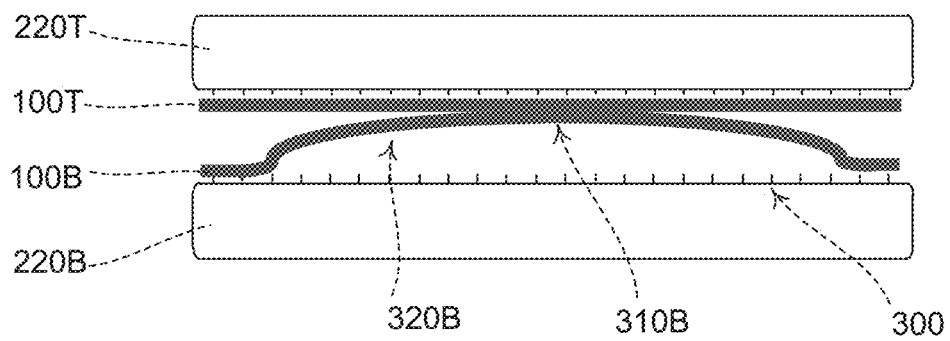

As shown in FIG. 8B, in some embodiments, the vents 300 in the region of the bottom chuck 220B corresponding to the middle rings 320B of the bottom wafer 100B can stop evacuating air, such that the gas between the inner rings 310B of the bottom wafer 100B and the bottom chuck 220B can fill into the space between the middle rings 320B of the bottom wafer 100B and the bottom chuck 220B. Thus, a second gas pressure can deform the middle rings 320B of the bottom wafer 100B, such that the middle rings 320B of the bottom wafer 100B can also protrude under the second gas pressure, and be in contact with the top wafer 100T.

In the same time, the vents 300 in the region of the bottom chuck 220B corresponding to outer rings of the bottom wafer 100B can still evacuate gas to keep the outer rings of the bottom wafer 100B being attached on the bottom chuck 220B. During the operation 720, the vents 300 on the top chuck 220T can evacuate gas to keep the entire top wafer 100T being attached on the top chuck 220T. It is noted that, in some embodiments, a maintaining time of the second gas pressure applied to the inner rings 310B and the middle rings 320B of the bottom wafer 100B can be determined based on the expansion rate of the bottom wafer determined at operation 440 described above in connection with FIG. 4.

Referring back to FIG. 7, after the maintaining time, the process 700 can processes to operation 730, in which the inner rings 310T of the top wafer 100T can be released from the top chuck 220T, and a third gas pressure can be applied to the inner rings 310T of the top wafer 100T. In some embodiments, the third gas pressure is smaller than the first gas pressure.

Figure 8C:
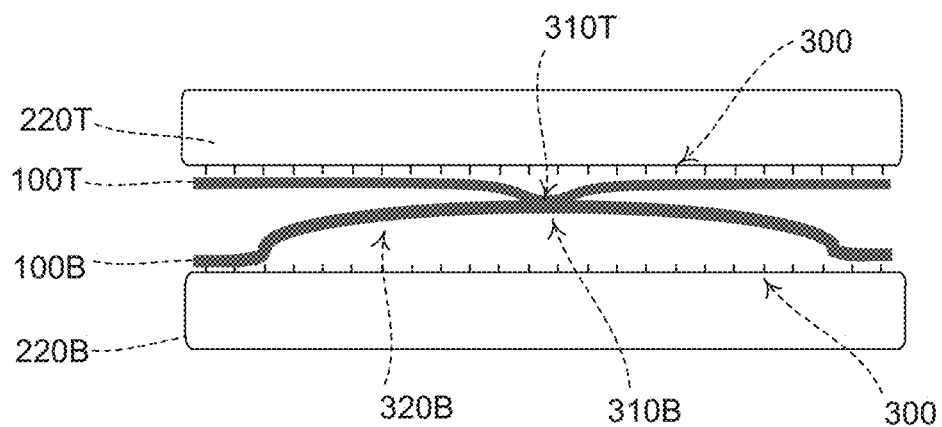

As shown in FIG. 8C, in some embodiments, the vents 300 in the region of the top chuck 220T corresponding to the inner rings 310T of the top wafer 100T can purge gas, such that the inner rings 310T of the top wafer 100T can protrude under the third gas pressure. The third gas pressure in the space between the inner rings 310T of the top wafer 100T and the top chuck 220T can be controlled by the volume of gas purged into the space through the vents 300. The third gas pressure can be smaller than the first gas pressure. The third gas pressure can be smaller than the first gas pressure in order to depress the deformation of the inner rings 310T of the top wafer 100T. Thus, the gas supply tubes connected with the vents 300 in the region of the top chuck 220T corresponding to the inner rings 310T of the top wafer 100T can be turned on and then quickly turned off.

Figure 8D:
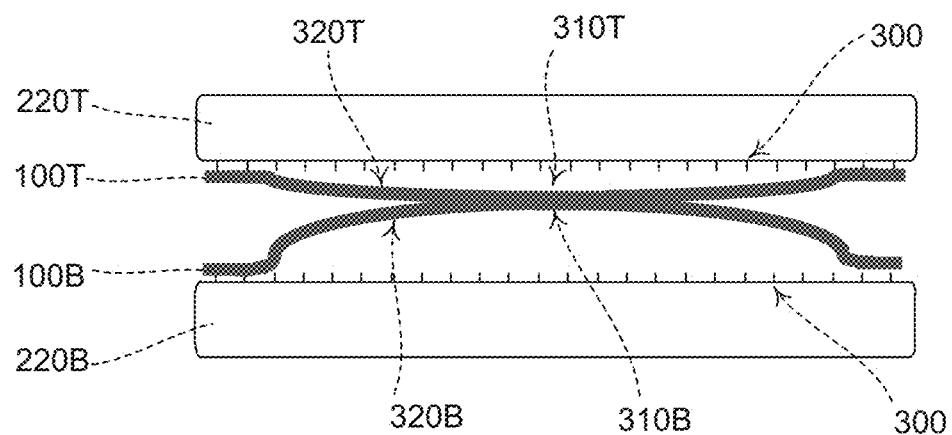

Referring back to FIG. 7, after releasing the inner rings 310T of the top wafer 100T, the process 700 can processes to operation 740, in which the middle rings 320T of the top wafer 100T can be quickly released from the top chuck 220T. As shown in FIG. 8D, in some embodiments, the vents 300 in the region of the top chuck 220T corresponding to the middle rings 320T of the top wafer 100T can stop evacuate air, such that the gas between the inner rings 310I of the top wafer 100T and the top chuck 220T can fill into the space between the middle rings 320T of the top wafer 100T and the top chuck 220T. Since the third gas pressure is small, a resulted fourth gas pressure in the space between the middle rings 320T of the top wafer 100T and the top chuck 220T is even smaller, which may not significantly deform the middle rings 320T of the top wafer 100T. It is noted that, during the operations 730 and 740, the second gas pressure in the space between the middle rings 320B and inner rings 310B of the bottom wafer 100B and the bottom chuck 220B can be maintained to keep the expansion deformation of the bottom wafer 100B.

Figure 8E:
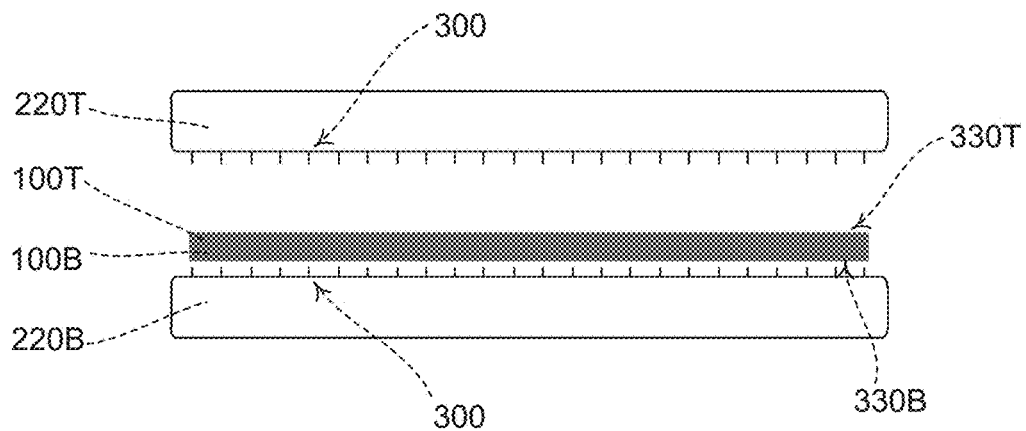

Referring back to FIG. 7, after releasing the middle rings 320T of the top wafer 100T, the process 700 can processes to operation 750, in which the outer rings 330B and 330T of both of the bottom wafer 100B and the top wafer 100T can be released simultaneously. As shown in FIG. 8E, the vents 300 in the region of the top chuck 220T corresponding to the outer rings 330T of the top wafer 100T, and the vents 300 in the region of the bottom chuck 220B corresponding to the outer rings 320B of the bottom wafer 100B can stop evacuate gas simultaneously. As such, the entire top wafer 100T and the entire bottom wafer 100B can be released from the chucks. Thus, the top wafer 100T and the bottom wafer 100B can be bonded together, while an expansion deformation of the bottom wafer 100B is implemented.

It should be noted that the above steps of the flow diagrams of FIGS. 4 and 7 can be executed or performed in any order or sequence not limited to the order and sequence shown and described in the figure. Also, some of the above steps of the flow diagrams of FIGS. 4 and 7 can be executed or performed substantially simultaneously where appropriate or in parallel to reduce latency and processing times. Furthermore, it should be noted that FIGS. 4 and 7 are provided as examples only. At least some of the steps shown in the figures may be performed in a different order than represented, performed concurrently, or altogether omitted.

Figure 9:
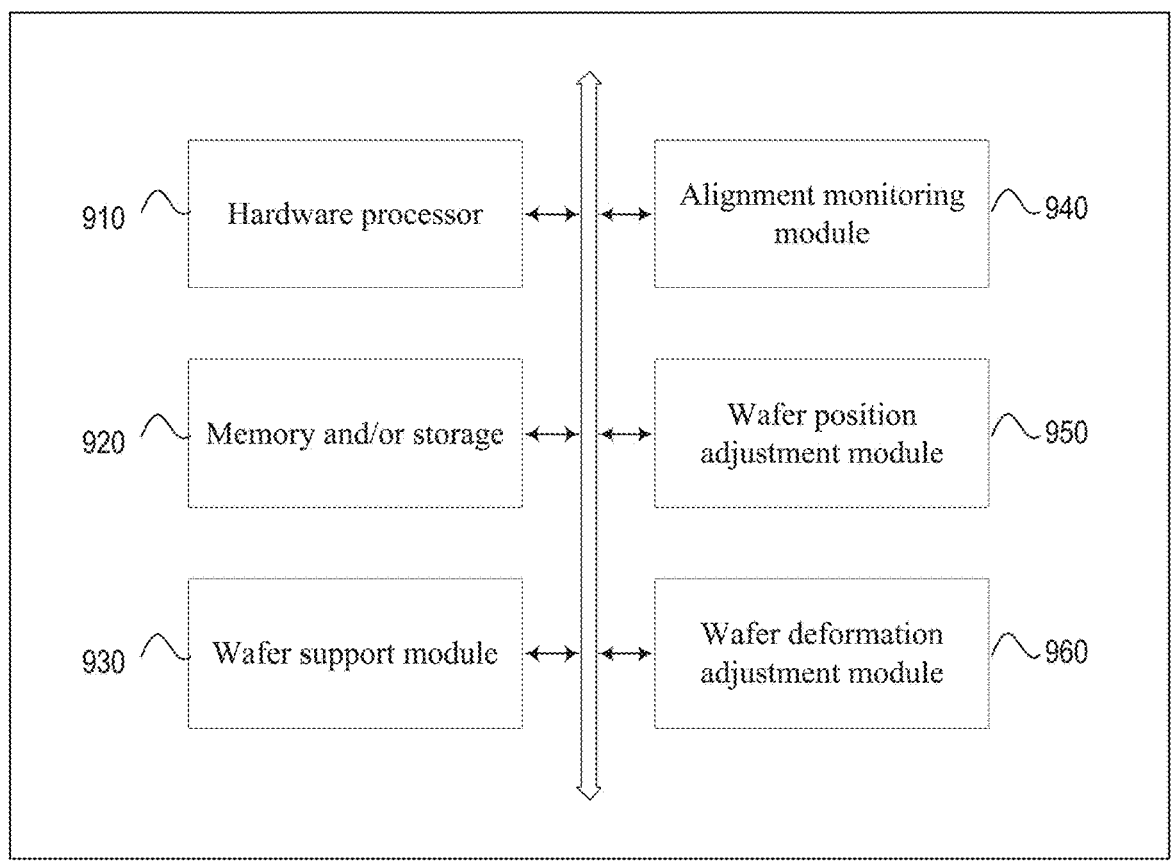
FIG. 9 illustrates a schematic structural diagram of an exemplary wafer bonding system according to some embodiments of the disclosure.

Referring to FIG. 9, a schematic structural diagram of an exemplary wafer bonding system 900 is illustrated in accordance with some embodiments of the disclosure. As shown in FIG. 8, the wafer bonding system 900 can include a hardware processor 910, a memory and/or storage 920, a wafer support module 930, an alignment monitoring module 940, a wafer position adjustment module 950, and a wafer deformation adjustment module 960. In some embodiments, the wafer bonding system 900 can further include a bus for communicating components of the wafer bonding system 900, a communication interface for input/output information, a power system for supplying power of the wafer bonding system 900, and/or any other suitable components.

The hardware processor 910 can include any suitable hardware processor, such as a microprocessor, a microcontroller, a central processing unit (CPU), a network processor (NP), a digital signal processor (DSP), an application specific integrated circuit (ASIC), a field-programmable gate array (FPGA), or another programmable logic device, discrete gate or transistor logic device, discrete hardware component. The hardware processor 910 is configured to implement or execute part or all of the methods consistent with the disclosure, such as one of the exemplary methods for adjusting wafer deformation during wafer bonding described above.

The memory and/or storage 920 can be any suitable memory and/or storage for storing programs, data, instructions, and/or any other suitable content in some embodiments. For example, the memory and/or storage 920 can include a random access memory (RAM), read only memory, flash memory, non-volatile memory, such as hard disk storage, optical media, and/or any other suitable storage device. In some embodiments, the memory and/or storage 820 includes a non-transitory computer-readable storage medium storing instructions that, when executed by the hardware processor 910, cause the hardware processor 910 to perform the methods consistent with the disclosure, such as one of the exemplary methods for adjusting wafer deformation during wafer bonding described above.

The wafer support module 930 can include a first support and a second support for supporting a bottom wafer and a top wafer respectively. Each of the first support and the second support can include a stage having an aperture, and a chuck mounted on or attached to the aperture of the stage. In some embodiments, the chuck can be substantially transparent. For example, the chuck may comprise glass, quartz, or other type of transparent material. In other embodiments, the chuck may comprise a translucent or opaque material.

The alignment monitoring module 940 can include any suitable optical equipment for monitoring bonding alignment marks on the bottom wafer and/or the top wafer, and detecting the positions of the bonding alignment marks. For example, the alignment monitoring module can include one or more infrared (IR) charge coupled device (CCD) scopes comprising an IR live CCD configured to emit reflective infrared (RIR) or transparent infrared (TIR) energy. In some embodiments, the alignment monitoring module 940 can further include any suitable optical equipment for positioning the bonding alignment marks, such as a linear variable differential transformer (LVDT), a laser interferometer, or an optical linear encoder and decoder, etc.

The wafer position adjustment module 950 can be controlled by the hardware processor 910 to adjust the positions of the wafer support module 930. In some embodiments, the wafer position adjustment module 950 can include any suitable equipment coupled with the first support and/or the second support, such as a piezoelectric motor, a linear motor, etc. The wafer position adjustment module 950 can be configured to adjust linear positions (e.g., x-coordinate position, y-coordinate position, and z-coordinate position), and/or an angular position of the bottom wafer and/or the top wafer by controlling the movement of the first support and/or the second support.

The wafer deformation adjustment module 960 can be controlled by the hardware processor 910 to adjust the deformation of the bottom wafer and/or the top wafer. In some embodiments, wafer deformation adjustment module 960 includes a plurality of suction holes and vent holes on the chucks of the wafer support module 930. The plurality of suction holes and vent holes can be controlled by the hardware processor 910 to adjust the gas pressure between the bottom/top wafer and the corresponding chuck during the bonding process.

In some embodiments, the process of the disclosed methods in various embodiments can be directly executed by a hardware decoding processor, or by a decoding processor including a hardware module and a software module. The software module may reside in any suitable storage/memory medium, such as a random access memory, a flash memory, a read-only memory, a programmable read-only memory, an electrically erasable programmable memory, a register, etc. The storage medium can be located in the memory and/or storage 920. The hardware processor 910 can implement the processes of the disclosed method by using the hardware and the information read from the memory and/or storage 920.

The flowcharts and blocks in the figures may illustrate various embodiments of the disclosed methods and systems, as well as architectures, functions and operations that can be fully or partially implemented by a computer program product. In this case, each block of the flowcharts or block diagrams may represent a module, a code segment, a portion of program code. Each module, each code segment, and each portion of program code may include one or more executable instructions for implementing predetermined logical functions. It is also noted that, each block in the block diagrams and/or flowcharts, as well as the combinations of the blocks in the block diagrams and/or flowcharts, can be realized by a dedicated hardware-based system for executing specific functions, or can be realized by a dedicated system including hardware and computer instructions.

Accordingly, methods and systems for adjusting wafer deformation during wafer bonding are provided.

The method for adjusting wafer deformation during wafer bonding comprises: (i) releasing inner rings of a first wafer from a first chuck, and applying a first gas pressure to the inner rings of the first wafer, such that the inner rings of the first wafer are in contact with a second wafer; (ii) releasing middle rings of the first wafer from the first chuck, such that the middle rings of the first wafer are deformed under a second gas pressure and in contact with the second wafer; (iii) releasing inner rings of the second wafer from a second chuck, and applying a third gas pressure to the inner rings of the second wafer, wherein the third gas pressure is smaller than the first gas pressure; (iv) releasing middle rings of the second wafer from the second chuck; and (v) releasing outer rings of the first wafer from the first chuck and releasing outer rings of the second wafer from the second chuck simultaneously.

In some embodiments, the method further comprises: before operation (i), bonding a first pair of wafers including a plurality of bonding alignment mark pairs on the first pair of wafers, wherein each wafer has a corresponding bonding alignment mark from each of the plurality of bonding alignment mark pairs; analyzing a run-out misalignment between the first pair of wafers based on a measurement of the plurality of bonding alignment mark pairs; and determining an expansion rate of one of a second pair of wafers based on the analysis for compensating the run-out misalignment; wherein the second pair of wafers includes the first wafer and the second wafer, and the first gas pressure is determined based at least on the expansion rate.

In some embodiments, analyzing the run-out misalignment between the first pair of wafers comprises: calculating a run-out misalignment between the bonding alignment marks of each bonding alignment mark pair; and calculating an average of the run-out misalignments corresponding to the plurality of bonding alignment mark pairs as the run-out misalignment between the first pair of wafers.

In some embodiments, calculating the run-out misalignment between each bonding alignment mark pair comprises: determining a first distance between a center of a top wafer of the first pair of wafers and a first bonding alignment mark in a bonding alignment mark pair that is on the top wafer; determining a second distance between the first bonding alignment mark and a second bonding alignment mark in the bonding alignment mark pair that is on a bottom wafer of the first pair of wafers; determining an angle between a connection line of the bonding alignment mark pair and a radiation direction of the first bonding alignment mark on the top wafer; and calculating the run-out misalignment between the bonding alignment mark pair based on the first distance, the second distance, and the angle.

In some embodiments, the method further comprises: before operation (i), determining the first wafer is a top wafer of the second pair of wafers if the run-out misalignment between the first pair of wafers is positive; determining the first wafer is a bottom wafer of the second pair of wafers if the run-out misalignment between the first pair of wafers is negative; and determining the expansion rate of the first wafer based on a magnitude of the run-out misalignment between the first pair of wafers.

In some embodiments, the method further comprises: before operation (i), adjusting an initial distance between the first wafer and the second wafer based at least on the expansion rate.

In some embodiments, operation (i) comprises: purging gas, by a plurality of vents in a region of the first chuck corresponding to the inner rings of the first wafer, to generate the first gas pressure in a space between the inner rings of the first wafer and the first chuck, such that the inner rings of the first wafer protrude from the first chuck; and evacuating gas, by a plurality of vents in a region of the first chuck corresponding to the middle rings and the outer rings of the first wafer, such that the middle rings and outer rings of the first wafer are attached on the first chuck.

In some embodiments, operation (ii) comprises: stopping evacuating gas, by a plurality of vents in a region of the first chuck corresponding to the middle rings of the first wafer, such that the gas in the space between the inner rings of the first wafer and the first chuck fills into a space between the middle rings of the first wafer and the first chuck to generate the second gas pressure; and maintaining the second gas pressure for a time period determined based at least on the expansion rate, such that the middle rings of the first wafer are deformed under the second gas pressure.

In some embodiments, the method further comprises: evacuating gas, during operations (i) and (ii), by a plurality of vents on the second chuck, such that the second wafer is entirely attached on the second chuck.

In some embodiments, operation (iii) comprises: purging gas, by a plurality of vents in a region of the second chuck corresponding to the inner rings of the second wafer, to generate the third gas pressure in a space between the inner rings of the second wafer and the second chuck; and evacuating gas, by a plurality of vents in a region of the second chuck corresponding to the middle rings and the outer rings of the second wafer, such that the middle rings and outer rings of the second water are attached on the second chuck.

In some embodiments, operation (iv) comprises: stopping evacuating gas, by a plurality of vents in a region of the second chuck corresponding to the middle rings of the second wafer, such that the gas in the space between the inner rings of the second wafer and the second chuck fills into a space between the middle rings of the second wafer and the second chuck to generate a fourth gas pressure; wherein a deformation of the middle rings of the second wafer under the fourth gas pressure is less than the a deformation of the middle rings of the first water under the second gas pressure.

In some embodiments, operation (v) comprises: stopping evacuating gas simultaneously, by a plurality of vents in a region of the first chuck corresponding to the outer rings of the first wafer and a plurality of vents in a region of the second chuck corresponding to the outer rings of the second wafer, such that the first wafer and the second wafer are bonded with each other.

Another aspect of the present disclosure provides a system for bonding wafers, comprising: a wafer support module including a first chuck and a second chuck configured to support a first pair of wafers respectively; an alignment monitoring module configured to measure positions of a plurality of bonding alignment mark pairs on the first pair of wafers; a hardware processor configured to analyze a run-out misalignment between the first pair of wafers based on the positions of the plurality of bonding alignment mark pairs; a wafer position adjustment module configured to adjust positions of wafer support module; and a water deformation adjustment module configured to compensate the run-out misalignment during bonding of a second pair of waters by adjusting gas pressures between each of the second pair of wafers and the corresponding chuck.

In some embodiments, the hardware processor is further configured to: determine whether the run-out misalignment is within an allowable error range; and in response to determining that the run-out misalignment is outside the allowable error range, control the wafer position adjustment module to adjust an initial distance between a first wafer and a second water of the second pair of wafers, and control the wafer deformation adjustment module to compensate the run-out misalignment during bonding of the second pair of wafers.

In some embodiments, the wafer deformation adjustment module is configured to: (i) release inner rings of a first wafer from a first chuck, and apply a first gas pressure to the inner rings of the first wafer, such that the inner rings of the first wafer are in contact with a second wafer; (ii) release middle rings of the first wafer from the first chuck, such that the middle rings of the first water are deformed under a second gas pressure and in contact with the second wafer; (iii) release inner rings of the second wafer from a second chuck, and apply a third gas pressure to the inner rings of the top wafer, wherein the third gas pressure is smaller than the first gas pressure; (iv) release middle rings of the second wafer from the second chuck; and (v) release outer rings of the first wafer from the first chuck and releasing outer rings of the second wafer from the second chuck simultaneously.

In some embodiments, the hardware processor is further configured to: determine an expansion rate of one of the second pair of wafers based on the analysis for the run-out misalignment between the first pair of wafers; and determine the initial distance between a first wafer and a second wafer of the second pair of wafers, and the first gas pressure based at least on the expansion rate.

In some embodiments, the hardware processor is further configured to: calculating a run-out misalignment between the bonding alignment marks of each bonding alignment mark pair; and calculating an average of the run-out misalignments corresponding to the plurality of bonding alignment mark pairs as the run-out misalignment between the first pair of wafers.

In some embodiments, the hardware processor is further configured to: determining a first distance between a center of a top wafer of the first pair of wafers and a first bonding alignment mark in a bonding alignment mark pair that is on the top wafer; determining a second distance between the first bonding alignment mark and a second bonding alignment mark in the bonding alignment mark pair that is on a bottom wafer of the first pair of wafers; determining an angle between a connection line of the bonding alignment mark pair and a radiation direction of the first bonding alignment mark on the top wafer; and calculating the run-out misalignment between the bonding alignment mark pair based on the first distance, the second distance, and the angle.

In some embodiments, the hardware processor is further configured to: determine the first wafer is a top wafer of the second pair of wafers if the run-out misalignment between the first pair of wafers is positive; determine the first wafer is a bottom wafer of the second pair of wafers if the run-out misalignment between the first pair of wafers is negative; and determine the expansion rate of the first wafer based on a magnitude of the run-out misalignment between the first pair of wafers.

In some embodiments, the hardware processor is further configured to: control a plurality of vents in a region of the first chuck corresponding to the inner rings of the first wafer to purge gas to generate the first gas pressure in a space between the inner rings of the first wafer and the first chuck, such that the inner rings of the first wafer protrude from the first chuck; and control a plurality of vents in a region of the first chuck corresponding to the middle rings and the outer rings of the first wafer to evacuate gas, such that the middle rings and outer rings of the first wafer are attached on the first chuck.

In some embodiments, the hardware processor is further configured to: control a plurality of vents in a region of the first chuck corresponding to the middle rings of the first wafer to stop evacuating gas, such that the gas in the space between the inner rings of the first water and the first chuck fills into a space between the middle rings of the first wafer and the first chuck to generate the second gas pressure; and control the plurality of vents on the first chuck to maintain the second gas pressure for a time period determined based at least on the expansion rate, such that the middle rings of the first wafer are deformed under the second gas pressure.

In some embodiments, the hardware processor is further configured to: control a plurality of vents on the second chuck to evacuate gas during operations (i) and (ii), such that the second wafer is entirely attached on the second chuck.

In some embodiments, the hardware processor is further configured to: control a plurality of vents in a region of the second chuck corresponding to the inner rings of the second wafer to purge gas to generate the third gas pressure in a space between the inner rings of the second wafer and the second chuck; and control a plurality of vents in a region of the second chuck corresponding to the middle rings and the outer rings of the second wafer to evacuate gas, such that the middle rings and outer rings of the second wafer are attached on the second chuck.

In some embodiments, the hardware processor is further configured to: control a plurality of vents in a region of the second chuck corresponding to the middle rings of the second wafer to stop evacuating gas, such that the gas in the space between the inner rings of the second wafer and the second chuck fills into a space between the middle rings of the second water and the second chuck to generate a fourth gas pressure; wherein a deformation of the middle rings of the second wafer under the fourth gas pressure is less than the a deformation of the middle rings of the first wafer under the second gas pressure.

In some embodiments, the hardware processor is further configured to: control a plurality of vents in a region of the first chuck corresponding to the outer rings of the first wafer and a plurality of vents in a region of the second chuck corresponding to the outer rings of the second wafer to stop evacuating gas simultaneously, such that the first water and the second wafer are bonded with each other.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for bonding waters, comprising:
   (i) releasing inner rings of a first wafer from a first chuck, and applying a first gas pressure to the inner rings of the first wafer, such that the inner rings of the first wafer are in contact with a second wafer;
   (ii) releasing middle rings of the first wafer from the first chuck, such that the middle rings of the first wafer are deformed under a second gas pressure and in contact with the second wafer;
   (iii) releasing inner rings of the second wafer from a second chuck, and applying a third gas pressure to the inner rings of the second wafer, wherein the third gas pressure is smaller than the first gas pressure;
   (iv) releasing middle rings of the second wafer from the second chuck; and
   (v) releasing outer rings of the first wafer from the first chuck and releasing outer rings of the second wafer from the second chuck simultaneously.

2. The method of claim 1, before operation (i), further comprising:
   bonding a first pair of wafers including a plurality of bonding alignment mark pairs on the first pair of wafers, wherein each wafer has a corresponding bonding alignment mark from each of the plurality of bonding alignment mark pairs;
   analyzing a run-out misalignment between the first pair of wafers based on a measurement of the plurality of bonding alignment mark pairs; and
   determining an expansion rate of one of a second pair of wafers based on the analysis for compensating the run-out misalignment;
   wherein the second pair of wafers includes the first wafer and the second wafer, and the first gas pressure is determined based at least on the expansion rate.

3. The method of claim 2, before operation (i), further comprising:
   determining the first wafer is one of the second pair of wafers based on a sign of the run-out misalignment between the first pair of wafers;
   determining the expansion rate of the first water based on a magnitude of the run-out misalignment between the first pair of wafers; and
   adjusting an initial distance between the first wafer and the second wafer based at least on the expansion rate.

4. The method of claim 2, wherein operation (i) comprises:
   purging gas, by a plurality of vents in a region of the first chuck corresponding to the inner rings of the first wafer, to generate the first gas pressure in a space between the inner rings of the first wafer and the first chuck, such that the inner rings of the first wafer protrude from the first chuck; and evacuating gas, by a plurality of vents in a region of the first chuck corresponding to the middle rings and the outer rings of the first wafer, such that the middle rings and outer rings of the first wafer are attached on the first chuck.

5. The method of claim 4, wherein operation (ii) comprises:

stopping evacuating gas, by a plurality of vents in a region of the first chuck corresponding to the middle rings of the first wafer, such that the gas in the space between the inner rings of the first wafer and the first chuck fills into a space between the middle rings of the first wafer and the first chuck to generate the second gas pressure; and maintaining the second gas pressure for a time period determined based at least on the expansion rate, such that the middle rings of the first wafer are deformed under the second gas pressure.

6. The method of claim 5, further comprising:

evacuating gas, during operations (i) and (ii), by a plurality of vents on the second chuck, such that the second wafer is entirely attached on the second chuck.

7. The method of claim 5, wherein operation (iii) comprises:

purging gas, by a plurality of vents in a region of the second chuck corresponding to the inner rings of the second wafer, to generate the third gas pressure in a space between the inner rings of the second wafer and the second chuck; and evacuating gas, by a plurality of vents in a region of the second chuck corresponding to the middle rings and the outer rings of the second wafer, such that the middle rings and outer rings of the second wafer are attached on the second chuck.

8. The method of claim 7, wherein operation (iv) comprises:

stopping evacuating gas, by a plurality of vents in a region of the second chuck corresponding to the middle rings of the second wafer, such that the gas in the space between the inner rings of the second wafer and the second chuck fills into a space between the middle rings of the second wafer and the second chuck to generate a fourth gas pressure;

wherein a deformation of the middle rings of the second wafer under the fourth gas pressure is less than a deformation of the middle rings of the first wafer under the second gas pressure.

9. The method of claim 8, wherein operation (v) comprises:

stopping evacuating gas simultaneously, by a plurality of vents in a region of the first chuck corresponding to the outer rings of the first wafer and a plurality of Vents in a region of the second chuck corresponding to the outer rings of the second wafer, such that the first wafer and the second wafer are bonded with each other.

10. A system for bonding wafers, comprising:

a wafer support module including a first chuck and a second chuck configured to support a first pair of wafers respectively;

an alignment monitoring module configured to measure positions of a plurality of bonding alignment mark pairs on the first pair of wafers;

a hardware processor configured to analyze a run-out misalignment between the first pair of wafers based on the positions of the plurality of bonding alignment mark pairs;

a wafer position adjustment module configured to adjust positions of wafer support module; and a wafer deformation adjustment module configured to compensate the run-out misalignment during bonding of a second pair of wafers by adjusting gas pressures between each of the second pair of wafers and the corresponding chuck.

11. The system of claim 10, wherein the wafer deformation adjustment module is configured to:

(i) release inner rings of a first wafer from a first chuck, and apply a first gas pressure to the inner rings of the first wafer, such that the inner rings of the first wafer are in contact with a second wafer;

(ii) release middle rings of the first wafer from the first chuck, such that the middle rings of the first wafer are deformed under a second gas pressure and in contact with the second wafer;

(iii) release inner rings of the second wafer from a second chuck, and apply a third gas pressure to the inner rings of the top wafer, wherein the third gas pressure is smaller than the first gas pressure;

(iv) release middle rings of the second wafer from the second chuck; and (v) release outer rings of the first wafer from the first chuck and releasing outer rings of the second wafer from the second chuck simultaneously.

12. The system of claim 11, wherein the hardware processor is further configured to:

calculating a run-out misalignment between the bonding alignment marks of each bonding alignment mark pair; and calculating an average of the run-out misalignments corresponding to the plurality of bonding alignment mark pairs as the run-out misalignment between the first pair of wafers.

13. The system of claim 12, wherein the hardware processor is further configured to:

determining a first distance between a center of a top wafer of the first pair of wafers and a first bonding alignment mark in a bonding alignment mark pair that is on the top wafer;

determining a second distance between the first bonding alignment mark and a second bonding alignment mark in the bonding alignment mark pair that is on a bottom wafer of the first pair of wafers;

determining an angle between a connection line of the bonding alignment mark pair and a radiation direction of the first bonding alignment mark on the top water; and calculating the run-out misalignment between the bonding alignment mark pair based on the first distance, the second distance, and the angle.

14. The system of claim 11, wherein the hardware processor is further configured to:

determining the first wafer is one of the second pair of wafers based on a sign of the run-out misalignment between the first pair of wafers;

determine an expansion rate of one of the second pair of wafers based on the analysis for the run-out misalignment between the first pair of wafers; and determine the initial distance between a first wafer and a second wafer of the second pair of wafers, and the first gas pressure based at least on the expansion rate.

15. The system of claim 14, wherein the hardware processor is further configured to:

control a plurality of vents in a region of the first chuck corresponding to the inner rings of the first wafer to purge gas to generate the first gas pressure in a space between the inner rings of the first wafer and the first chuck, such that the inner rings of the first wafer protrude from the first chuck; and control a plurality of vents in a region of the first chuck corresponding to the middle rings and the outer rings of the first wafer to evacuate gas, such that the middle rings and outer rings of the first wafer are attached on the first chuck.

16. The system of claim 15, wherein the hardware processor is further configured to:

control a plurality of vents in a region of the first chuck corresponding to the middle rings of the first wafer to stop evacuating gas, such that the gas in the space between the inner rings of the first wafer and the first chuck fills into a space between the middle rings of the first wafer and the first chuck to generate the second gas pressure; and control the plurality of vents on the first chuck to maintain the second gas pressure for a time period determined based at least on the expansion rate, such that the middle rings of the first wafer are deformed under the second gas pressure.

17. The system of claim 16, wherein the hardware processor is further configured to:

control a plurality of vents on the second chuck to evacuate gas during operations (i) and (ii), such that the second wafer is entirely attached on the second chuck.

18. The system of claim 17, wherein the hardware processor is further configured to:

control a plurality of vents in a region of the second chuck corresponding to the inner rings of the second wafer to purge gas to generate the third gas pressure in a space between the inner rings of the second wafer and the second chuck; and control a plurality of vents in a region of the second chuck corresponding to the middle rings and the outer rings of the second wafer to evacuate gas, such that the middle rings and outer rings of the second wafer are attached on the second chuck.

19. The system of claim 18, wherein the hardware processor is further configured to:

control a plurality of vents in a region of the second chuck corresponding to the middle rings of the second wafer to stop evacuating gas, such that the gas in the space between the inner rings of the second wafer and the second chuck fills into a space between the middle rings of the second wafer and the second chuck to generate a fourth gas pressure;

wherein a deformation of the middle rings of the second wafer under the fourth gas pressure is less than a deformation of the middle rings of the first wafer under the second gas pressure.

20. The system of claim 19, wherein the hardware processor is further configured to:

control a plurality of vents in a region of the first chuck corresponding to the outer rings of the first wafer and a plurality of vents in a region of the second chuck corresponding to the outer rings of the second wafer to stop evacuating gas simultaneously, such that the first wafer and the second wafer are bonded with each other.

* * * * *